US008199918B2

(12) United States Patent
Butler

(10) Patent No.: US 8,199,918 B2
(45) Date of Patent: Jun. 12, 2012

(54) LOUDSPEAKER PROTECTION CIRCUIT

(75) Inventor: Joel Butler, Springfield, MO (US)

(73) Assignee: SLS International, Inc., Ozark, MI (US)

( * ) Notice: Subject to any disclaimer, the term of this patent is extended or adjusted under 35 U.S.C. 154(b) by 1002 days.

(21) Appl. No.: 11/970,331

(22) Filed: Jan. 7, 2008

(65) Prior Publication Data

US 2008/0165977 A1 Jul. 10, 2008

Related U.S. Application Data

(60) Provisional application No. 60/884,167, filed on Jan. 9, 2007.

(51) Int. Cl.
*H03G 11/00* (2006.01)

(52) U.S. Cl. ........................................................ 381/55

(58) Field of Classification Search ..................... 381/55
See application file for complete search history.

(56) References Cited

U.S. PATENT DOCUMENTS

| | | | | |
|---|---|---|---|---|
| 3,991,370 | A * | 11/1976 | Pate | 455/108 |
| 4,301,330 | A * | 11/1981 | Trump | 381/55 |
| 5,577,126 | A * | 11/1996 | Klippel | 381/59 |
| 5,646,602 | A * | 7/1997 | Gertz et al. | 340/4.41 |
| 5,729,611 | A * | 3/1998 | Bonneville | 381/55 |
| 7,120,256 | B2 * | 10/2006 | Grancea et al. | 381/55 |
| 7,672,462 | B2 * | 3/2010 | Schneider et al. | 381/55 |
| 2004/0234079 | A1 * | 11/2004 | Schneider et al. | 381/58 |
| 2008/0056504 | A1 * | 3/2008 | Gorges et al. | 381/55 |

* cited by examiner

*Primary Examiner* — Victor A Mandala
(74) *Attorney, Agent, or Firm* — Hovey Williams LLP

(57) ABSTRACT

A loudspeaker protection circuit comprises a rectification stage for receiving an input audio signal and producing a rectified output signal, a detection stage for passing the rectified output signal when the rectified output signal is greater than a predetermined level, a timing stage for receiving the rectified output signal from the detection stage and producing a time-varying charge signal, a regulation stage for producing a regulated output signal based on the input audio signal, an actuator stage for actuating a switch based on the time-varying charge signal and the regulated output signal, and an attenuation stage for attenuating an output audio signal when the switch is actuated.

17 Claims, 16 Drawing Sheets

LOUDSPEAKER PROTECTION CIRCUIT

RELATED APPLICATIONS

The present application claims priority benefit to U.S. provisional patent application entitled "LOUDSPEAKER PROTECTION CIRCUIT", Ser. No. 60/884,167, filed Jan. 9, 2007. This provisional application is incorporated into the present application by reference.

BACKGROUND OF THE INVENTION

1. Field of the Invention

Embodiments of the present invention relate to loudspeaker protection circuitry. More particularly, embodiments of the present invention relate to a low-cost, sonically transparent, multi-stage loudspeaker protection circuit that protects a loudspeaker device from RMS and short-duration transient over-voltage conditions while accommodating adjustable threshold and dynamic attack timing.

2. Description of the Related Art

It is often desirable to protect a loudspeaker from excessive voltage and current conditions which may lead to permanent damage to the loudspeaker. It is also desirable to allow permissible voltages and currents to pass to the loudspeaker without significant attenuation, distortion, or filtration. Due to the variety of loudspeaker transducer designs, voltage and current limits vary significantly; however, typical transducers can handle large power levels for a short duration and reduced power levels for longer durations, as will be discussed later. Many attempts have been made to protect loudspeaker transducers from over-voltage and/or over-current conditions through protective circuitry. Unfortunately, these attempts have failed to adequately protect the transducer while allowing all permissible voltages and currents to pass unaltered.

Existing protection circuits have generally used a combination of actuating devices and attenuating devices. Actuating devices have been selected to actuate during over-voltage or over-current conditions and include such devices as thermistors, lamps, relays, fuses, diodes, etc. Some actuating devices, such as lamps, thermistors, diodes, etc., are considered self-actuating in that they do not require detection and/or triggering circuitry. Unfortunately, self-actuating devices are not adjustable and actuation threshold can vary significantly depending on ambient temperature and/or production tolerances. Other actuating devices, such as relays, are considered controlled actuating devices because they require detection and triggering circuitry to control the actuation. Attenuating devices have been used to attenuate, or reduce the unwanted voltages or currents and include such devices as resistors, lamps, diodes, thyristors, etc. Some devices, such as lamps, are both actuating and attenuating devices. In other words, such a device will actuate at certain voltages and currents by becoming a resistive attenuating element. Attenuating devices can further be grouped as variable attenuators or fixed attenuators. A resistor with constant impedance would be considered a fixed attenuator, while a lamp with current & heat dependant impedance would be considered a variable attenuator.

Referring to FIG. 1A, two aspects of typical loudspeaker power handling performance are presented; required attenuation and time duration. Typical loudspeakers have a rated power handling specification, below which the transducer will operate without damage illustrated by the dotted line, 44. The left axis, 40, corresponds to an attenuation value in decibels (dB). The solid line, 42, represents the loudspeakers required attenuation to sustain proper operation without damage to the transducer. The right vertical axis, 46, corresponds to time in seconds (sec). The dashed line, 48, represents the loudspeakers power handling as a function of time duration in seconds. The common horizontal axis, 50, represents increasing power. As evident in FIG. 1A, the loudspeaker requires increasing attenuation as the input power level exceeds the rated power of the loudspeaker. Also, as the input power increases, the duration of time within which the loudspeaker will operate without damage steadily decreases. Effective loudspeaker protection should seek to provide adequate attenuation above the rated power handling of the transducer, and should control the duration of power levels in excess of the rating. Additionally, effective loudspeaker protection should seek to allow all power levels below the transducer rating to pass unaltered, i.e. minimal attenuation, filtration, and distortion.

Referring to FIG. 1B, required attenuation and time duration plots of a typical loudspeaker are overlaid with a typical self-actuating, self-attenuating lamp. The lamp's attenuation is represented by the solid line, 52, and the time response to reach the nominal attenuation is represented by the dashed line 54. As evident in FIG. 1B, the lamp self-actuates and attenuates before the loudspeaker's power handling rating, 44, and begins a linear increase in attenuation. Unfortunately, the lamps attenuation plateaus and is significantly less than what the loudspeaker requires to maintain damage-free operation. Shaded region 56 illustrates the damage region in which the loudspeaker would receive more power than the specified rating. The lamps time response is very fast, as evident by dotted line 54, clearly faster than the required response time of the loudspeaker, 48. Unfortunately, the lamp's excessive speed will clamp transient power levels quicker than required resulting in a less-musical solution. Lamps also have a nominal impedance even when they are not actuated or lighting, which results in a measurable insertion loss. Additionally, lamps have a maximum power rating and the filament can be damaged upon over-powering the device, which greatly limits the operational power range of circuits that incorporate lamps without subsequent filament protection.

Referring to FIG. 1C, required attenuation and time duration plots of a typical loudspeaker are overlaid with a typical self-actuating thermistor (usually a Positive Temperature Coefficient device, PTC). The PTC attenuation is represented by the solid line, 52, and the time response to reach the nominal attenuation is represented by the dashed line 54. As evident in FIG. 1B, the PTC actuates slightly before the loudspeaker's power handling rating, 44, and steps quickly in attenuation. While the PTC does offer adequate attenuation, the fast-acting step attenuation response is not musical and easily detected by the human ear. The PTC time response is very slow, as evident by dotted line 54, and is clearly slower than the required response time of the loudspeaker, 48. Shaded region 56 illustrates the damage region in which the loudspeaker would receive longer power durations than the specified rating. Unfortunately, while selecting smaller PTC devices will speed the time response, the actuation threshold is typically much less than the desired power rating of the loudspeaker. Additionally, PTC devices will remain actuated with a small amount of trickle current, leading to poor release and recovery performance. PTC actuation thresholds will also vary greatly depending upon the ambient temperature, greatly limiting the effective operational temperature range of circuits incorporating such devices. Because of these problems, designers have great difficulty finding a single PTC device that meets all of the desired requirements with respect to time, attenuation, actuation thresholds, and release performance.

Referring to FIG. 1D, required attenuation and time duration plots of a typical loudspeaker are overlaid with a typical relay and a single lamp attenuator. The attenuation characteristic, solid line 52, is the same as a single lamp; however, the lamp is not allowed to actuate below the power rating of loudspeaker. Unfortunately, the inadequate attenuation of the lamp at higher power levels remains a problem and allows operation in the damage region, 56. Replacing the lamp attenuator with a constant impedance attenuator results is a large stepped attenuation, which is not musical and easily detected by the human ear. The relay time response is very fast, as evident by dotted line 54, clearly faster than the required response time of the loudspeaker, 48. Unfortunately, the excessive speed will clamp transient power levels quicker than required, again making the protection topology less musical. Additionally, typical relay designs have suffered from actuation chatter wherein the relay actuates and releases rapidly when the input signal is crossing the relay coil threshold. Such chatter degrades the life of the relay contacts significantly.

Existing designs that incorporate thyristors or clamping diodes are effective in limiting peak voltages; however, excessive currents exist when clamping and can result in damage to the clamping device, the driving amplifier, or the passive crossover connected thereto. Such crow-bar, clamping techniques result in non-linear loading on the driving device and are not acceptable for protection circuits that are required to connect to a variety of different amplifiers and/or required to connect to the output of a passive crossover filter requiring proper termination.

In summary, existing protection circuits have suffered from the following problems: uncontrolled response time (excessively fast or slow), high insertion loss, frequency selectivity, abrupt stepped actuation, non-linear loading, inadequate peak voltage and current protection, limited operational power range, and actuation chatter.

SUMMARY OF THE INVENTION

The present invention overcomes the above-identified as well as other problems and disadvantages in the art of loudspeaker protection by providing a protection circuit operable to provide fully adjustable dynamic attack timing & threshold/s, minimized insertion loss, gradual dynamic attenuation, high speed peak over-voltage protection, wide operational power range, full-bandwidth operation, and anti-chatter hysteresis. Though not limited thereto, this protection circuit, when configured in multiple stages, is ideal for sensitive loudspeaker devices that require average and peak power limiting. It should also be noted that the present invention derives all necessary operational power from the audio signal driving the loudspeaker and does not require a secondary power source. This is ideal for passive loudspeakers wherein no secondary power supply is available.

The preferred loudspeaker protection circuit may be broadly comprised of a rectification stage, detection stage, a timing stage, an actuator stage, an attenuation stage, a regulation stage, and an optional load balancing stage. The rectification stage is operable to receive an audio input signal, AIN, and derive therefrom two rectified signals, AREC and VREC.

The detection stage is operable to receive the rectified signal, AREC, and continuously compare this signal with a predetermined threshold voltage. If the rectified signal, AREC, exceeds the preset threshold voltage, the detection stage activates its output signal, DTEC, thus triggering the subsequent timing stage. Though not limited to, the detection stage may contain filtration components designed to average AREC prior to threshold detection.

The timing stage is operable to receive the detection stage output signal, DTEC, and derive therefrom a time delayed output signal, DTIM. If the detection stage output signal, DTEC, goes inactive during the timing period leading up to DTIM activation, the timing stage may be designed to clear the timer and await the next trigger from DTEC. The timing stage may also be designed to receive the rectified audio signal, AREC, and derive therefrom a dynamically adjustable expiration time. The purpose of the timing stage is to provide a controlled attack time allowing brief DTEC triggers to pass without activating DTIM; however, activating DTIM when DTEC has remained active over the timer expiration period. Dynamically adjusting the timer expiration period based upon the rectified audio signal, AREC, is advantageous because loudspeaker power handling varies depending upon the duration of the applied signal. Though not limited thereto, the timing stage may contain multiple timing stages allowing multiple expiration times for various rectified audio, AREC, input signals.

The regulation stage is operable to receive the rectified signal, VREC, from the rectification stage and derive therefrom a regulated output signal, REG, used to power the actuation stage.

The actuation stage is operable to receive the timing stage output signal, DTIM, the regulation stage output, REG, and the audio input signal, AIN, and therefrom adequately control an actuator device. Selection of the actuator device depends upon the application and the desired connection to the attenuation stage and/or the optional load balancing stage. Though not limited thereto, the preferred actuator is a single-pole, double-throw relay with the pole connected to the audio input, AIN, the normally-closed contact connected to the audio output, AOUT, and the normally-open contact connected to an optional load balancing stage. An optional hysteresis technique can be implemented within the actuation stage to eliminate actuator chatter.

The attenuation stage may be designed to receive the audio input signal, AIN, and derive therefrom and attenuated audio signal, ATEN, connected directly to the audio output, AOUT. Alternatively, the attenuation stage may be designed to receive its input from a normally-open contact within the actuator stage. Selection of the attenuation device depends upon design requirements such as the amount of attenuation needed to protect the loudspeaker, desired response time of the attenuator, desired frequency response of the attenuator, and power handling requirements of the attenuator. Typically, the attenuation stage would be implemented with a combination of power resistors, lamps, capacitors, and/or inductors. Though not limited thereto, the preferred attenuator is a properly selected lamp.

The optional load balancing stage may be included to maintain constant load impedance, as seen at the audio input, AIN, throughout periods when the attenuator is engaged. This is critical for applications wherein the protection circuit is inserted after a passive crossover circuit or other passive filter that requires proper load termination to prevent excessive peaking and/or frequency response problems. The load balancing stage is operable to receive an audio signal from the normally-open contact of the actuator and connects a load impedance from this contact to the negative input of the audio input signal, AIN.

Though not limited thereto, it's often desirable to incorporate multiple stages of the present invention to allow for increased control of RMS and peak limiting. The preferred method of implementing a multi-stage protection circuit is to incorporate N number of detection, timing, actuation, and attenuation stages, while utilizing a common rectification stage, regulation stage, and optional load balancing stage. This technique, in conjunction with the selection of lamp attenuation stages, allows gradual linear attenuation but solves the typical lamp problem of insufficient attenuation at higher power levels and inherently protects the lamp filament from over-power conditions. Such a technique also allows the designer to more closely match the required attenuation performance of the loudspeaker.

BRIEF DESCRIPTION OF THE DRAWING FIGURES

A preferred embodiment of the present invention is described in detail below with reference to the attached drawing figures, wherein.

Figure 1A:
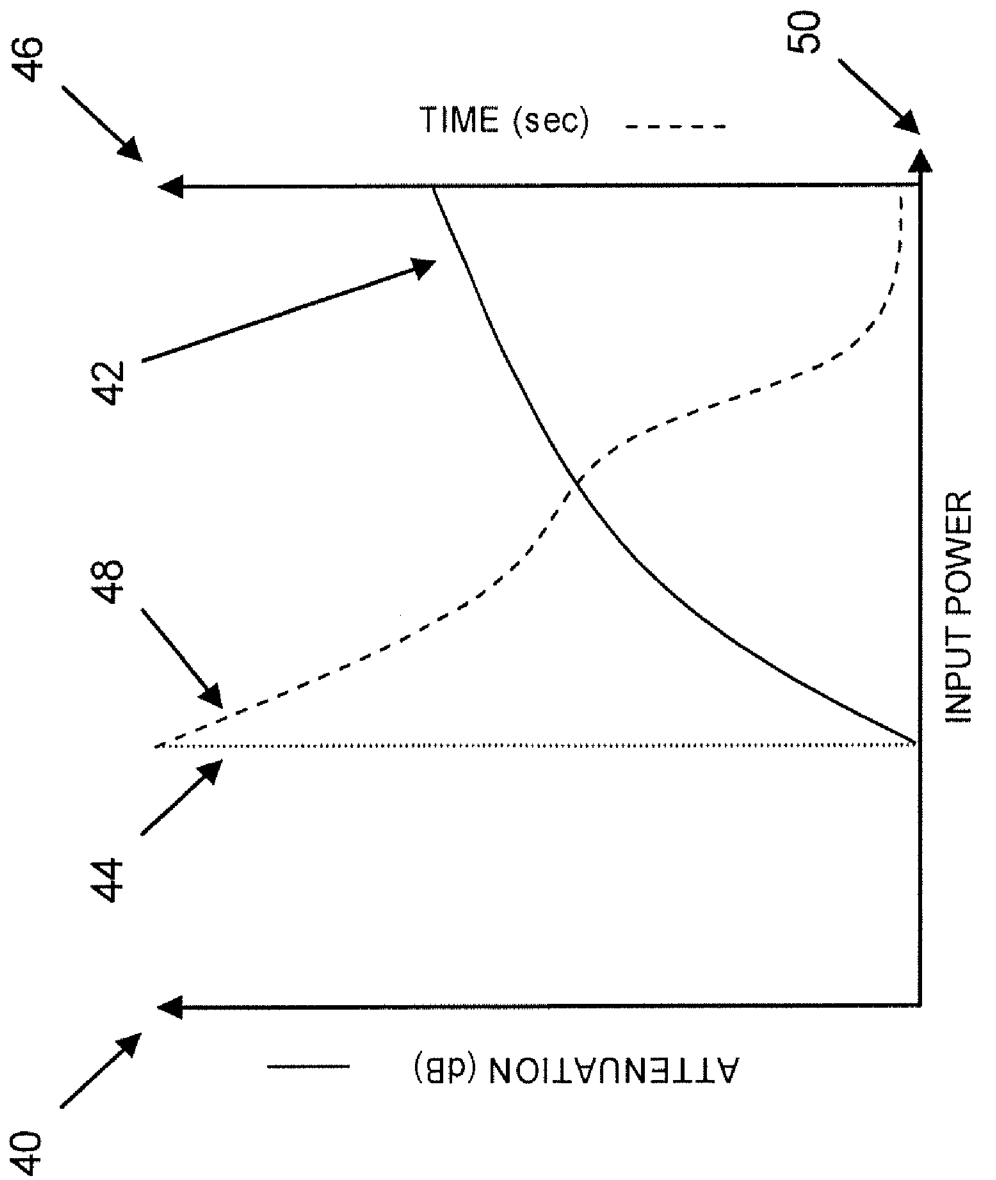
FIG. 1A is a plot of typical loudspeaker power handling characteristics.
Figure 1B:
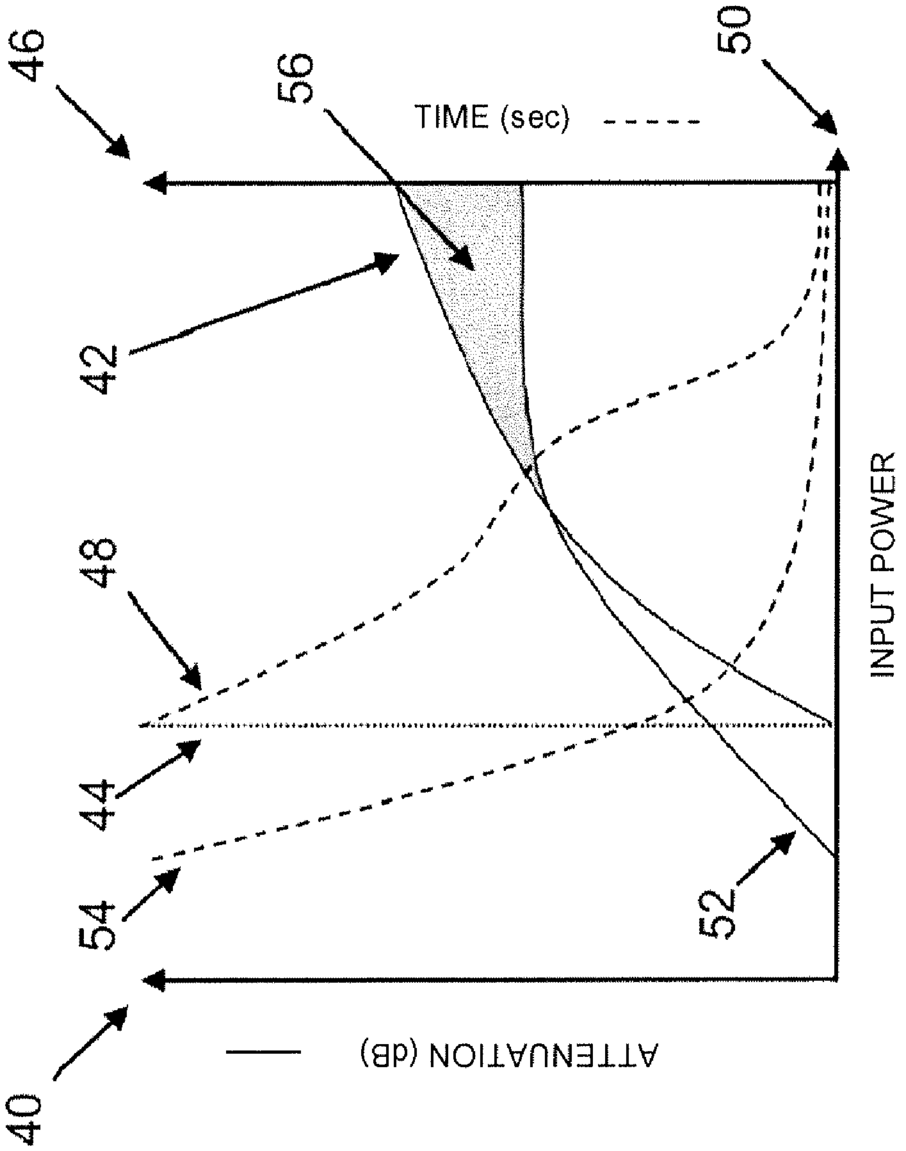
FIG. 1B is a plot of typical loudspeaker power handling characteristics overlaid with a typical self-actuating and attenuating lamp.
Figure 1C:
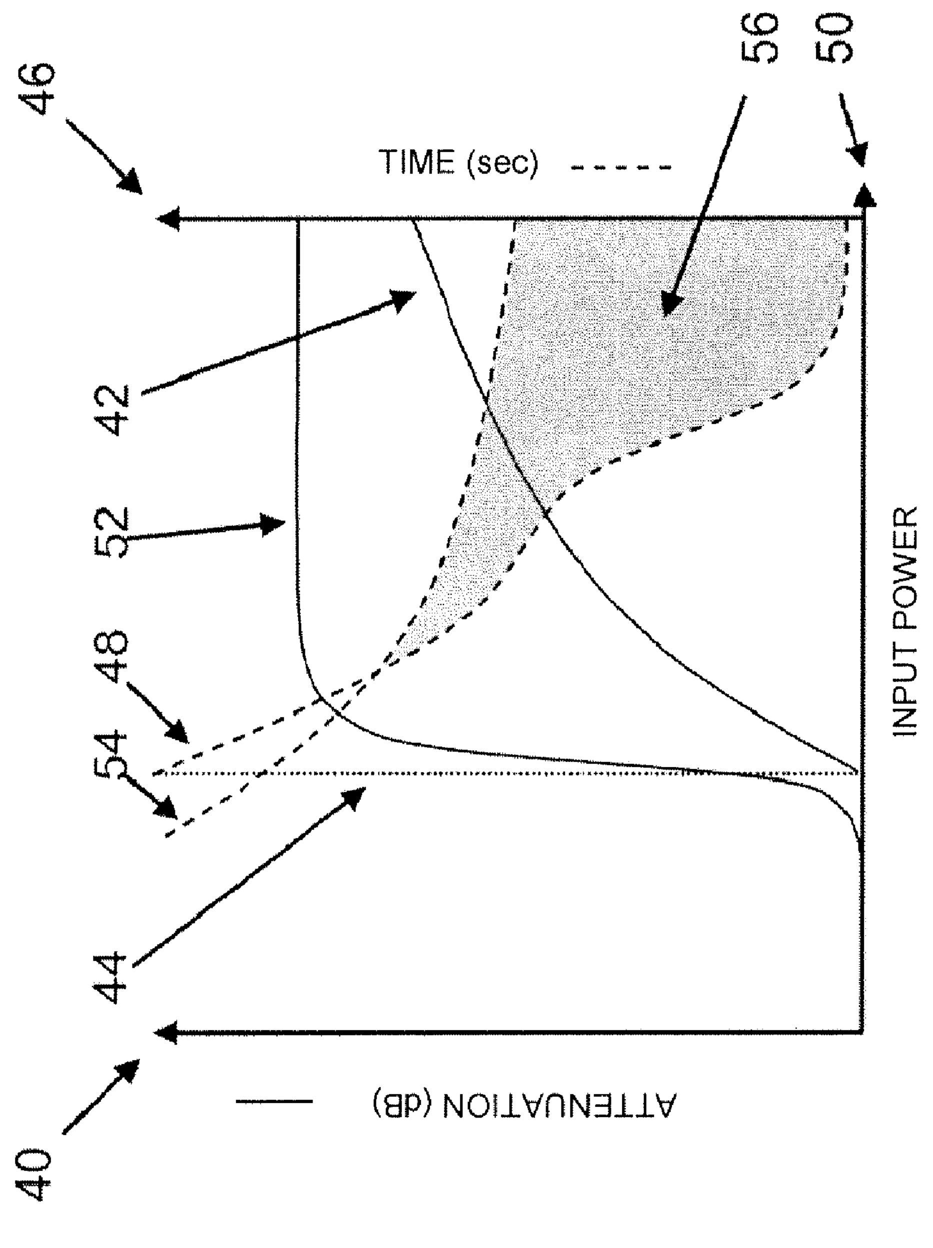
FIG. 1C is a plot of typical loudspeaker power handling characteristics overlaid with a typical self-actuating and attenuating thermistor.
Figure 1D:
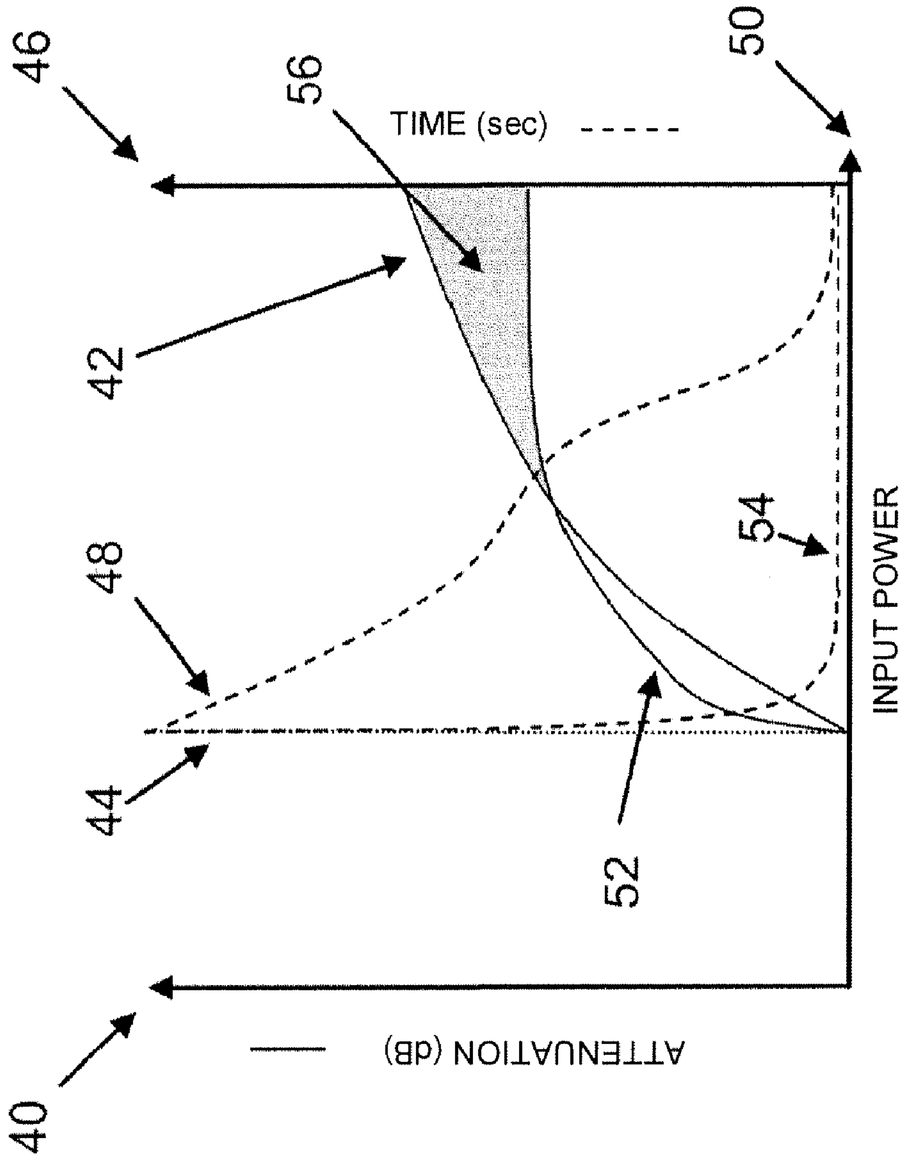
FIG. 1D is a plot of typical loudspeaker power handling characteristics overlaid with a typical controlled-actuating relay with lamp attenuator.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE PREFERRED EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Figure 2A:
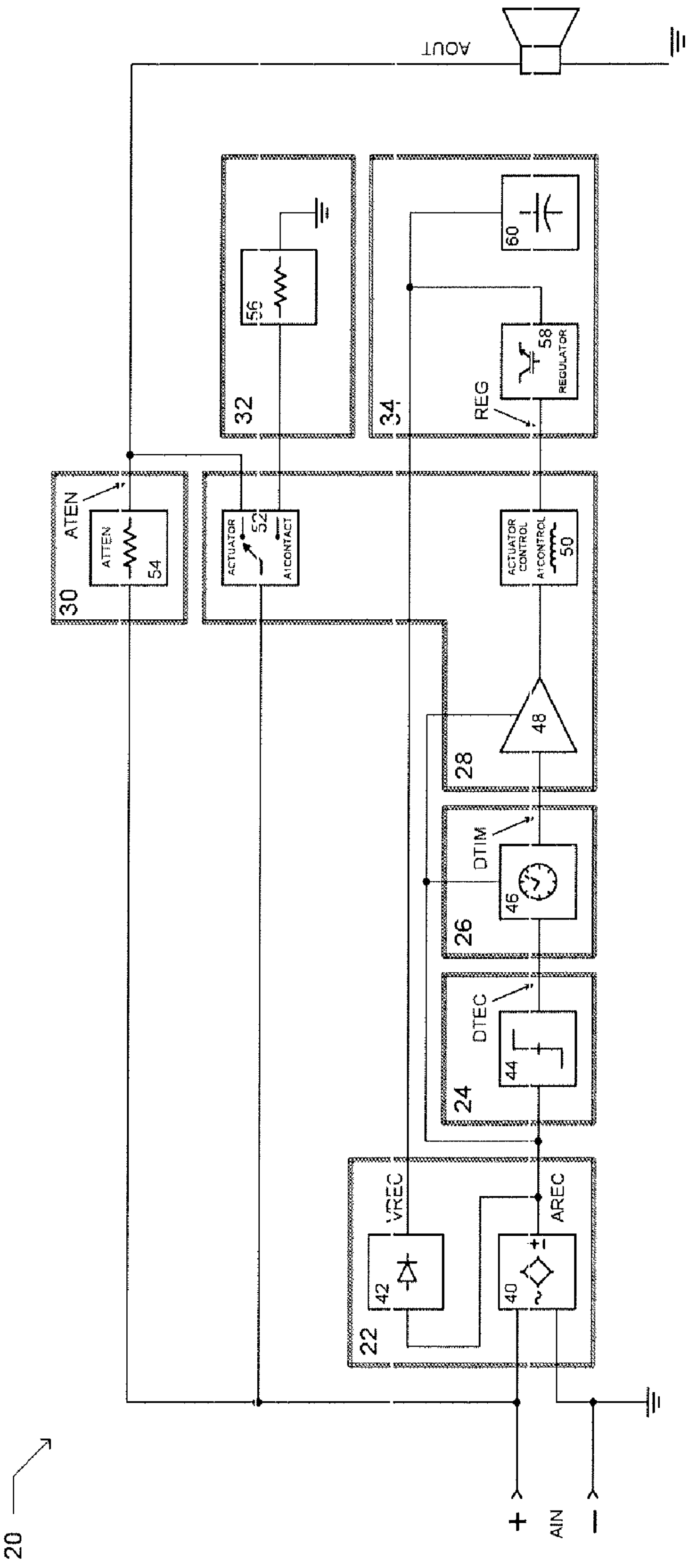
FIG. 2A is a block diagram of a first preferred embodiment of the present invention.

Referring to FIG. 2A, a protection circuit 20 is shown constructed in accordance with a preferred first embodiment of the present invention. The protection circuit 20 is operable to provide fully adjustable dynamic attack timing & threshold, minimized insertion loss, gradual dynamic attenuation, high speed peak over-voltage protection, wide operational power range, optional load balancing and full-bandwidth operation through the use of a voltage detector, a timer, actuator, attenuator, regulator, and optional load balancer. The preferred loudspeaker protection circuit broadly comprises a rectification stage 22; a detection stage 24; a timing stage 26; an actuator stage 28; an attenuation stage 30; a regulation stage 34; and an optional load balancing stage 32.

Figure 2B:
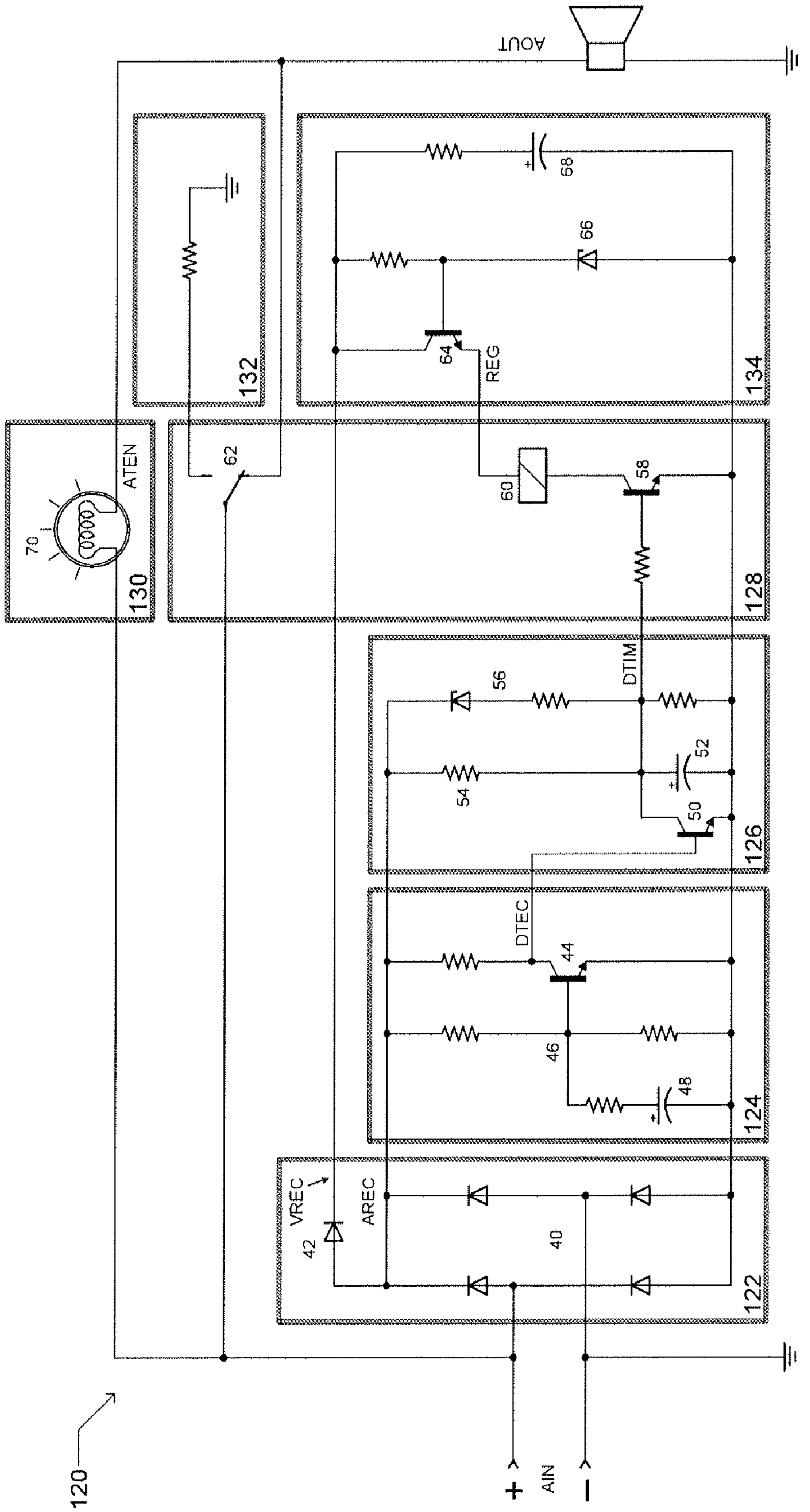
FIG. 2B is a circuit diagram of a first preferred embodiment of the present invention.

The rectification stage 22 is operable to derive two rectified signals, AREC and VREC, and broadly comprises a first rectifier circuit 40 followed by a subsequent second rectifier 42. The subsequent second rectifier 42 may be connected to the output of the said first rectifier 40, referred to as AREC, and is used to create a second rectified signal VREC. The first rectified signal, AREC, is supplied to the detection stage, 24, and the timing stage, 26. These subsequent stages are designed with relatively low capacitance, thereby maintaining AREC as a time-varying, rectified audio signal. Output of second rectifier 42, VREC, is supplied to the regulation stage 34 which includes smoothing capacitance, thereby ensuring that VREC is a time-averaged voltage. Referring to FIG. 2B, a detailed example of the first-embodiment 120, illustrates one possible implementation of the rectification stage wherein the first rectifier circuit 40 is constructed as a full-bridge rectifier utilizing four diodes and the second rectifier 42 is constructed with a single diode.

Referring to FIG. 2A, the detection stage 24 is operable to derive a trigger signal DTEC and broadly comprises a simplified threshold detector 44. Though not limited thereto, the preferred technique is to design detector 44 as a voltage threshold detector which monitors AREC compared to a predetermined voltage threshold. Once AREC exceeds the predetermined threshold, the detection stage 24 activates its output signal DTEC, thus triggering the subsequent timing stage 26. Referring to FIG. 2B, a detailed example of the first-embodiment 120, illustrates one possible implementation of the detection stage 124 wherein a single transistor 44 is used to monitor AREC, detect over-threshold voltages, and drive DTEC active low upon detection. A simplified voltage divider network and a simple resistive—capacitive filter network 48 is used to create detection node 46 which is connected to the base of transistor 44. Upon detection node 46 exceeding the turn-on voltage of transistor 44, the output signal DTEC is forced low thereby triggering the subsequent timing stage 126.

Referring to FIG. 2A, the timing stage 26 is operable to derive a time delayed signal DTIM and broadly comprises a retriggerable timing circuit 46. The purpose of the timing stage is to provide a controlled attack time allowing brief DTEC triggers to pass without activating DTIM; however, activating DTIM when DTEC has remained active over the timer expiration period. Referring to FIG. 2B, a detailed example of the first embodiment 120, illustrates one possible implementation of timing stage 126 wherein a two-stage, retriggerable, charge-up resistive capacitive timer network is employed. Transistor 50 is used to discharge and hold timing capacitor 52 and the resulting output signal DTIM low during durations when DTEC is inactive or high. Upon DTEC activation, transistor 50 is forced off, thereby allowing timing capacitor 52 to charge through either resistor 54 and/or resistor diode network 56. The charge time of capacitor 52 is governed by the capacitance value, resistor 54, resistor diode values in network 56, and the input voltage, AREC. Resistor diode network 56 is typically designed with a zener diode so as to provide a faster rate of charge on timing capacitor 52 when AREC exceeds the diodes zener voltage.

Referring to FIG. 2A, the actuation stage 28 is operable to drive a suitable actuator and broadly comprises a driver 48, an actuator controller 50, and an actuator switch 52. Selection of the actuator switch 52 depends upon the application and if the optional load balancing stage 32 will be installed. Referring to FIG. 2B, a detailed example of the first embodiment 120, illustrates one possible implementation of the actuation stage 128 wherein the driver is a simple transistor 58, the actuator controller is relay coil 60, and the actuator switch 62 is a single-pole, double throw (SPDT) relay contact closure. Driver transistor 58 detects when DTIM has reached an active high state, upon which it will become conductive, allowing current to pass through the relay coil 60. Relay coil 60 is powered from the regulation stage 134, and upon activation, will actuate relay switch 62. Relay switch 62 is illustrated as a SPDT with the single pole connected to the audio input, AIN, the normally-closed contact connected to the audio output, AOUT, and the normally-open contact connected to the option load balancing stage 132.

Referring to FIG. 2A, the regulation stage 34 is operable to derive a regulated output signal REG and broadly comprises a regulation device 58 and a capacitive smoothing network 60. Referring to FIG. 2B, a detailed example of the first embodiment 120, illustrates one possible implementation of regulation stage 134 wherein REG is derived through transistor 64 in conjunction with zener diode 66. Capacitor 68 is used to average the rectification stage output signal VREC and create a DC control voltage to supply transistor 64 and zener diode 66. This topology forms a simple voltage regulator capable of high voltage inputs.

Referring to FIG. 2A, attenuation stage 30 is operable to derive an attenuated signal ATEN from the audio input AIN and broadly comprises attenuation network 54. Alternatively, the attenuation stage may be designed to receive its input from a normally-open contact within the actuator stage instead of the audio input AIN. Attenuation network 54 is typically connected across the actuator switch 52 such that the attenuation is bypassed whenever the actuator is in the normally-closed position. Referring to FIG. 2B, a detailed example of the first embodiment 120, illustrates one possible implementation of attenuation stage 130 wherein the attenuation network consists of lamp 70. Though not limited thereto, a lamp allows gradual linear attenuation making the protection circuit much more musical and pleasing to human hearing upon activation. Lamp 70 is connected across the actuator switch 62 from the audio input AIN to the audio output AOUT.

Referring to FIG. 2A, the optional load balancing stage 32 is operable to maintain constant load impedance, as seen at the audio input, AIN, throughout periods when the attenuator 54 is engaged. Again referring to FIG. 2B, a detailed example of the first embodiment 120, illustrates one possible implementation of load balancing stage 132 wherein a simple resistive network is connected between the negative audio input AIN and the normally-open contact of the actuation relay switch 62. Load balancing is achieved when relay switch 62 is forced to the normally-open contact position.

Figure 6A:
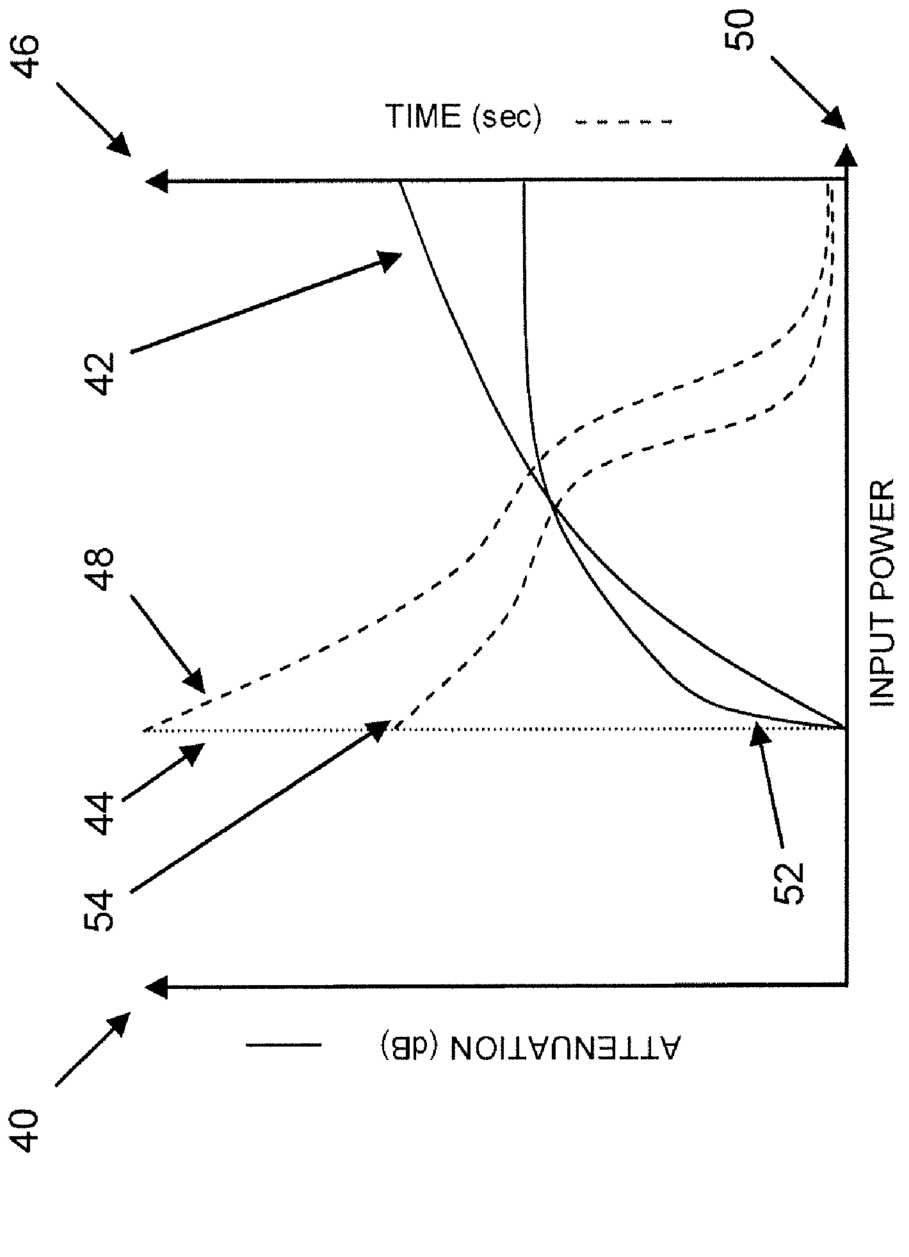
FIG. 6A is a plot of typical loudspeaker power handling characteristics overlaid with a typical first embodiment of the present invention.
Figure 7:
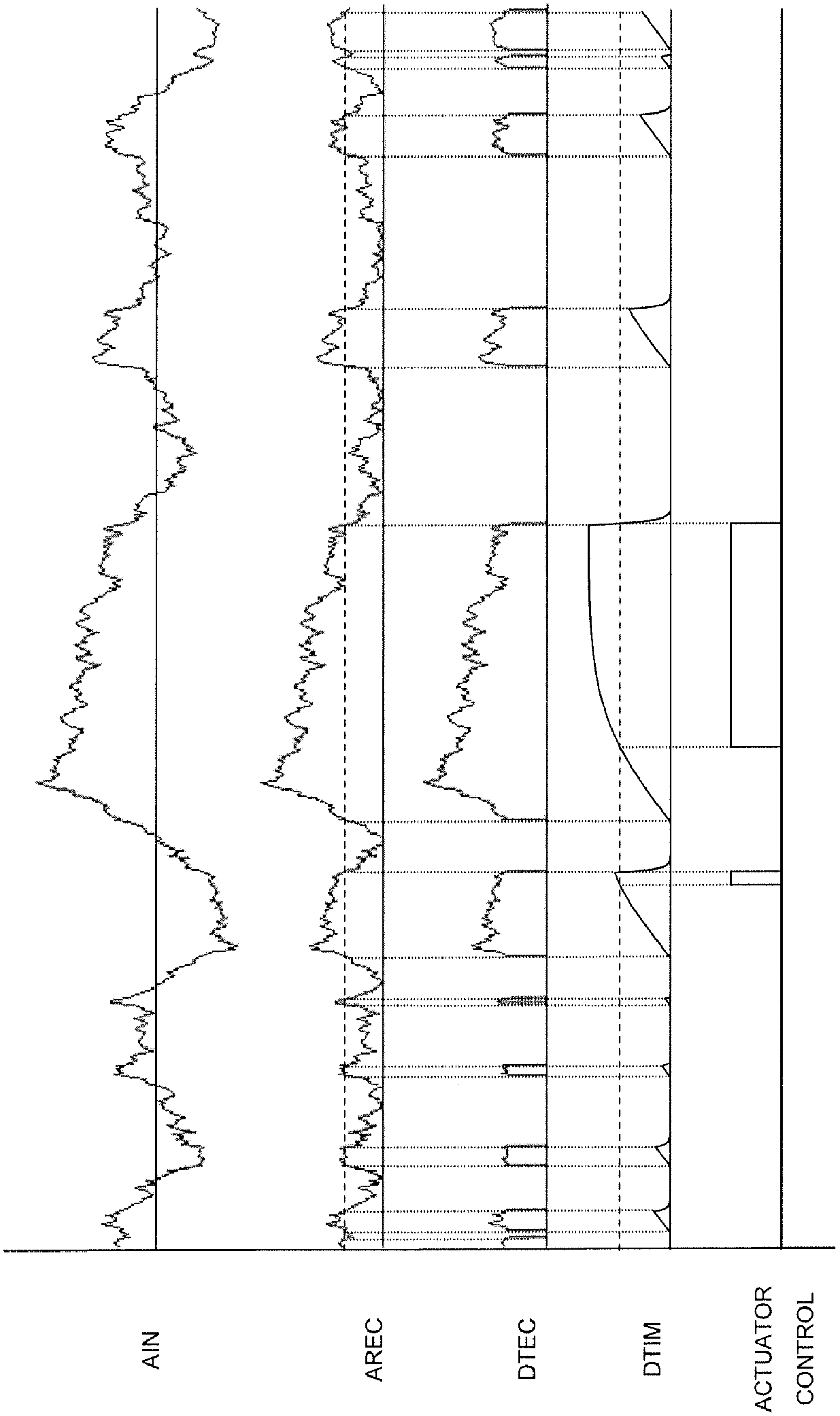
FIG. 7 is a timing diagram of a single-stage embodiment of the present invention.

The resulting characteristics of a first preferred embodiment are illustrated in FIG. 6A wherein the protection circuit broadly comprises one rectification stage, a detection stage, a timing stage, an actuation stage, a lamp attenuation stage, and one regulation stage. Time domain characteristics are illustrated in FIG. 7 wherein a timing diagram includes AIN, AREC, DTEC, DTIM, and Actuator Control signals.

Figure 3A:
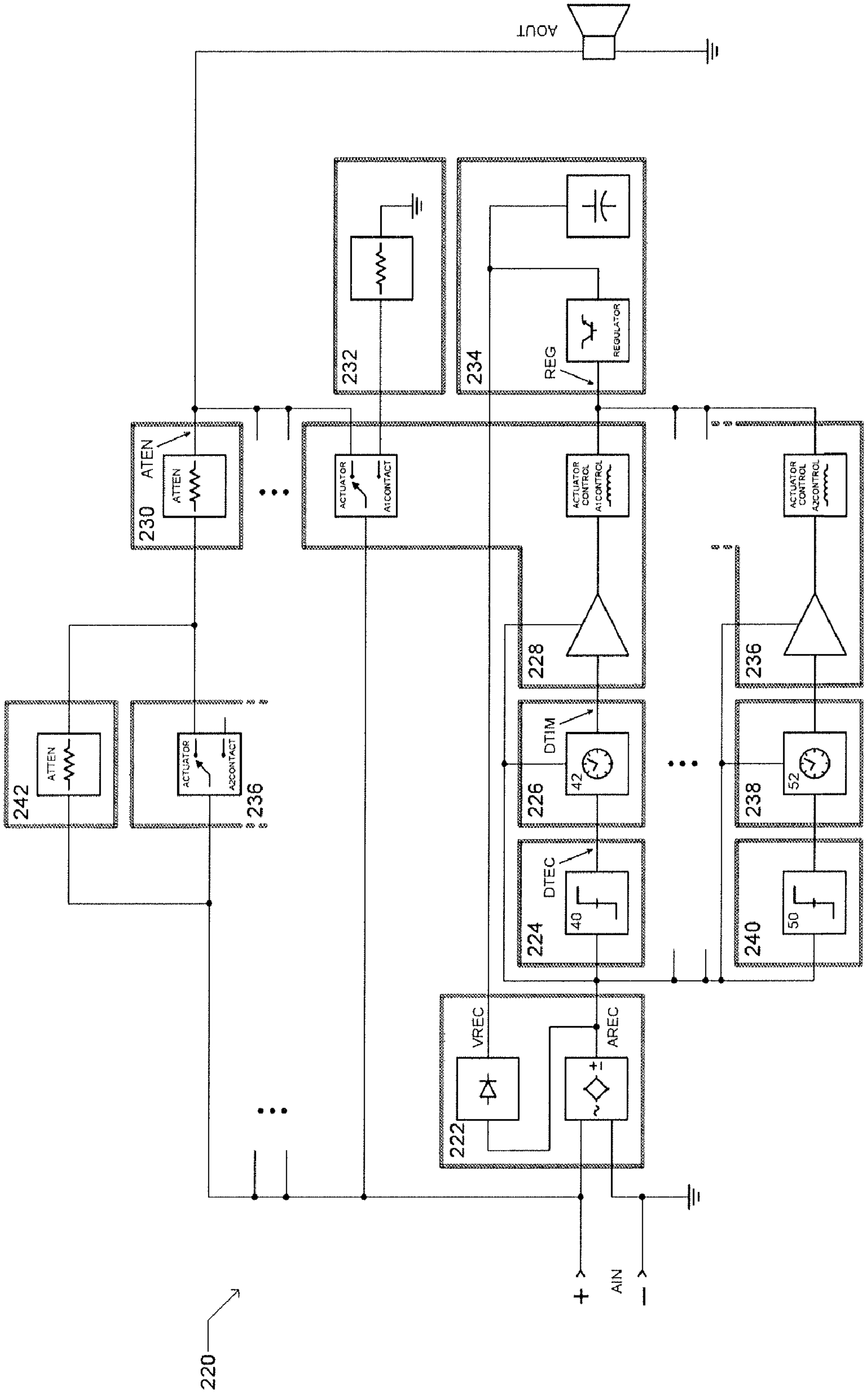
FIG. 3A is a block diagram of a multi-stage second preferred embodiment of the present invention.

Referring to FIG. 3A, a protection circuit 220 is shown constructed in accordance with a preferred second embodiment of the present invention. The protection circuit 220 is operable to provide multiple stages of fully adjustable dynamic attack timing & thresholds, minimized insertion loss, multiple stages of gradual dynamic attenuation, high speed peak over-voltage protection, wide operational power range, optional load balancing and full-bandwidth operation through the use of multiple voltage detectors, multiple timers, multiple actuators, multiple attenuators, regulator, and optional load balancer. The second preferred loudspeaker protection circuit broadly comprises the same stages as discussed in regards to the first preferred embodiment; however, includes a plurality of detection stages 224 & 240, timing stages 226 & 238, actuation stages 228 & 236, and attenuation stages 230 & 242. The purpose of adding multiple detectors, timers, actuators, and attenuators is to allow attenuation stage over-voltage protection (such a lamp filament protection) and allow more closely matched attenuation and timing characteristics when compared to the requirements of the loudspeaker being protected. The exact number of additional detection, timing, actuation, and attenuation stages needed depends upon the application; however, lab results indicate no more than three of each of these stages allows adequate control of attenuation and timing characteristics.

Typically, detection stage 240 is designed utilizing the same circuit topology as detection stage 224; however the threshold within detector 50 may be positioned at a different voltage than detector 40. Staggering of detector thresholds allows sequenced tripping as the audio input voltage AIN rises. Similarly, timing stage 238 may be designed utilizing the same circuit topology as timing stage 226; however expiration time within timer 52 may be significantly different than timer 42. Actuation stage 236 is typically designed utilizing the same circuit topology as actuation stage 228. Attenuation stage 242 is optional and can be implemented as any number of standard attenuation devices, i.e. lamps, resistors, etc.

Figure 3B:
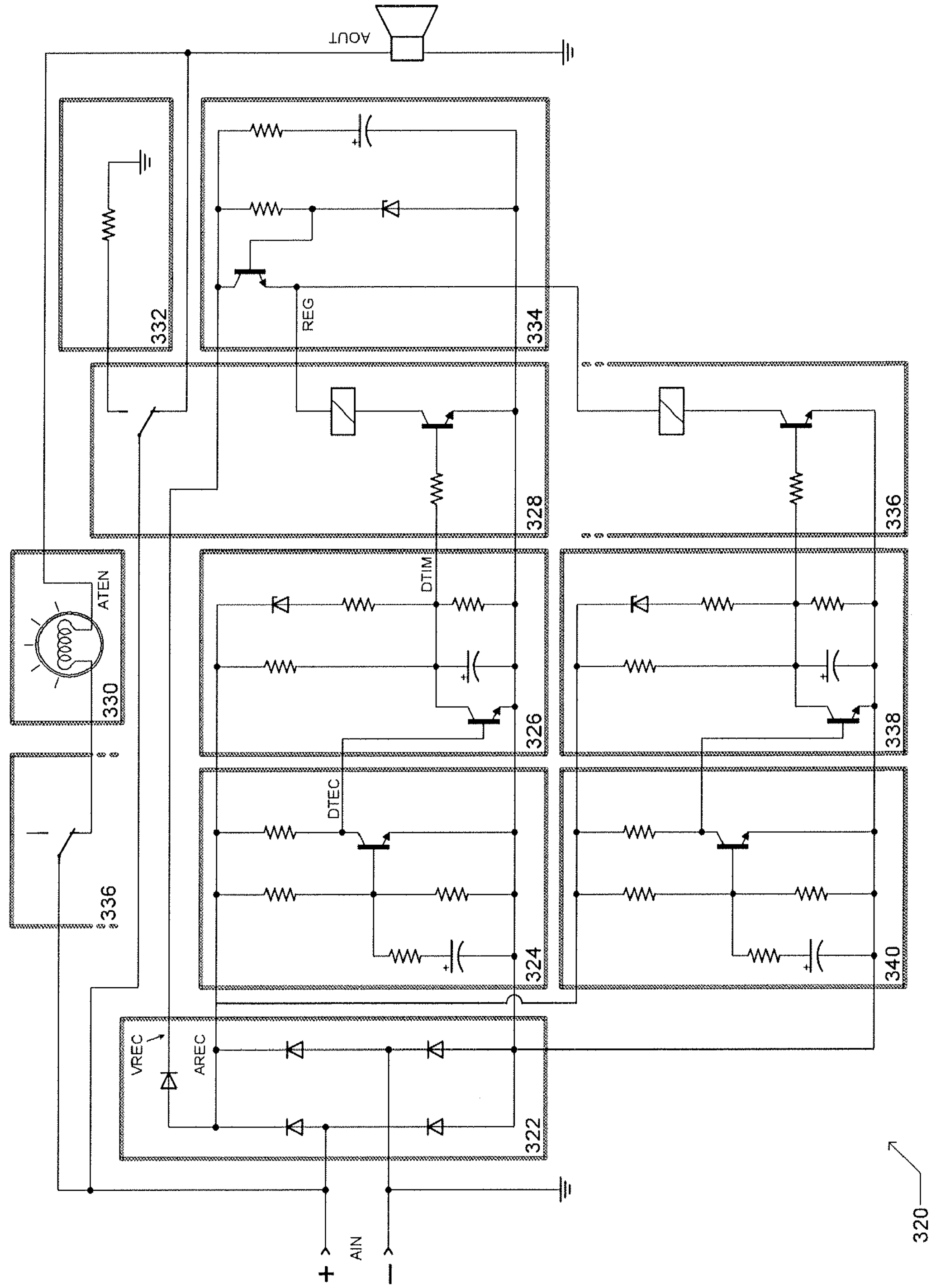
FIG. 3B is a circuit diagram of a multi-stage second preferred embodiment of the present invention.

Referring to FIG. 3B, a detailed example of the second embodiment 320, illustrates a two stage design including one rectification stage 322, two detection stages 324 & 340, two timing stages 326, & 338, two actuation stages 328 & 336, a single attenuation stage 330, an optional load balancing stage 332 and a regulation stage 334. A second attenuation stage is optional; however, lab results indicate a single lamp attenuator is satisfactory for most applications.

Figure 6B:
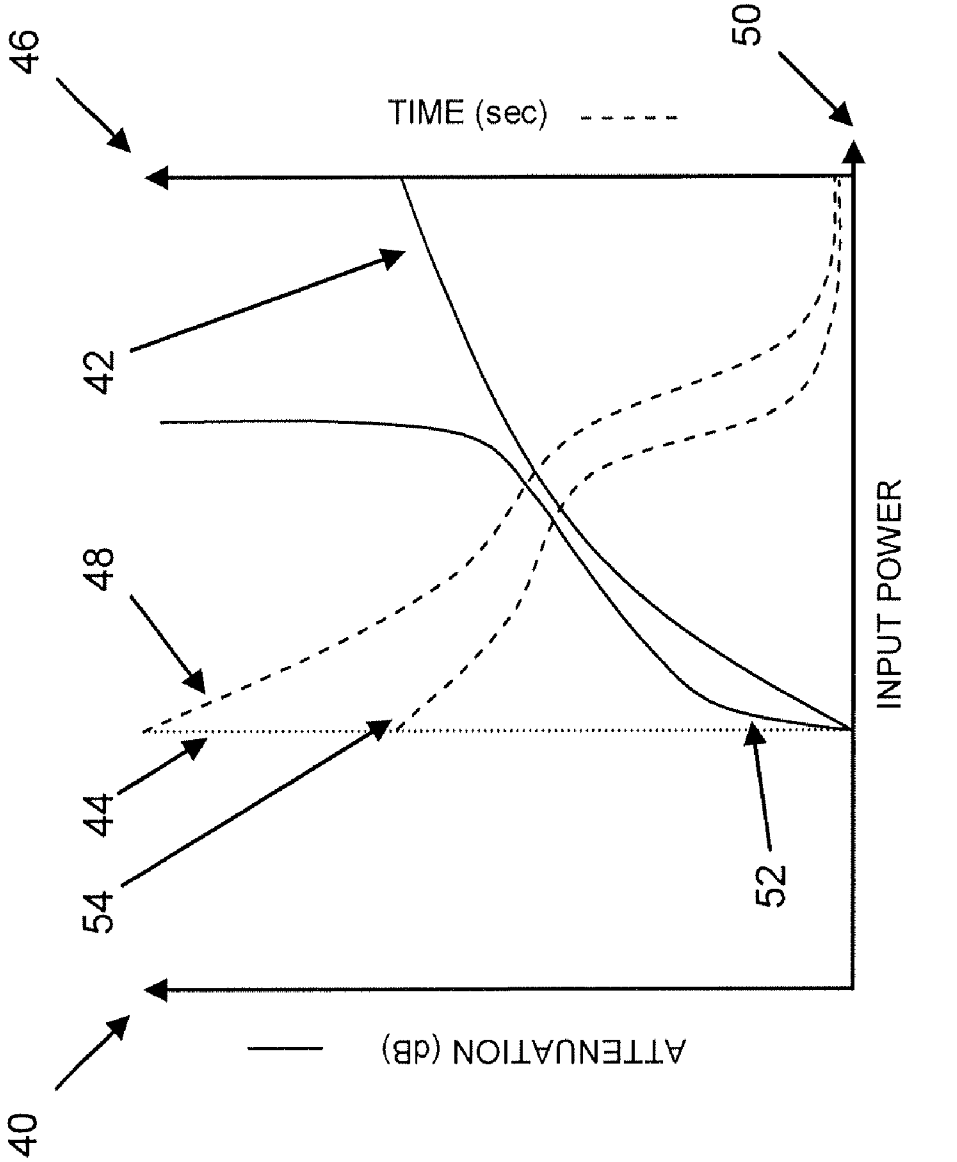
FIG. 6B is a plot of typical loudspeaker power handling characteristics overlaid with a typical two-stage second embodiment of the present invention.
Figure 6C:
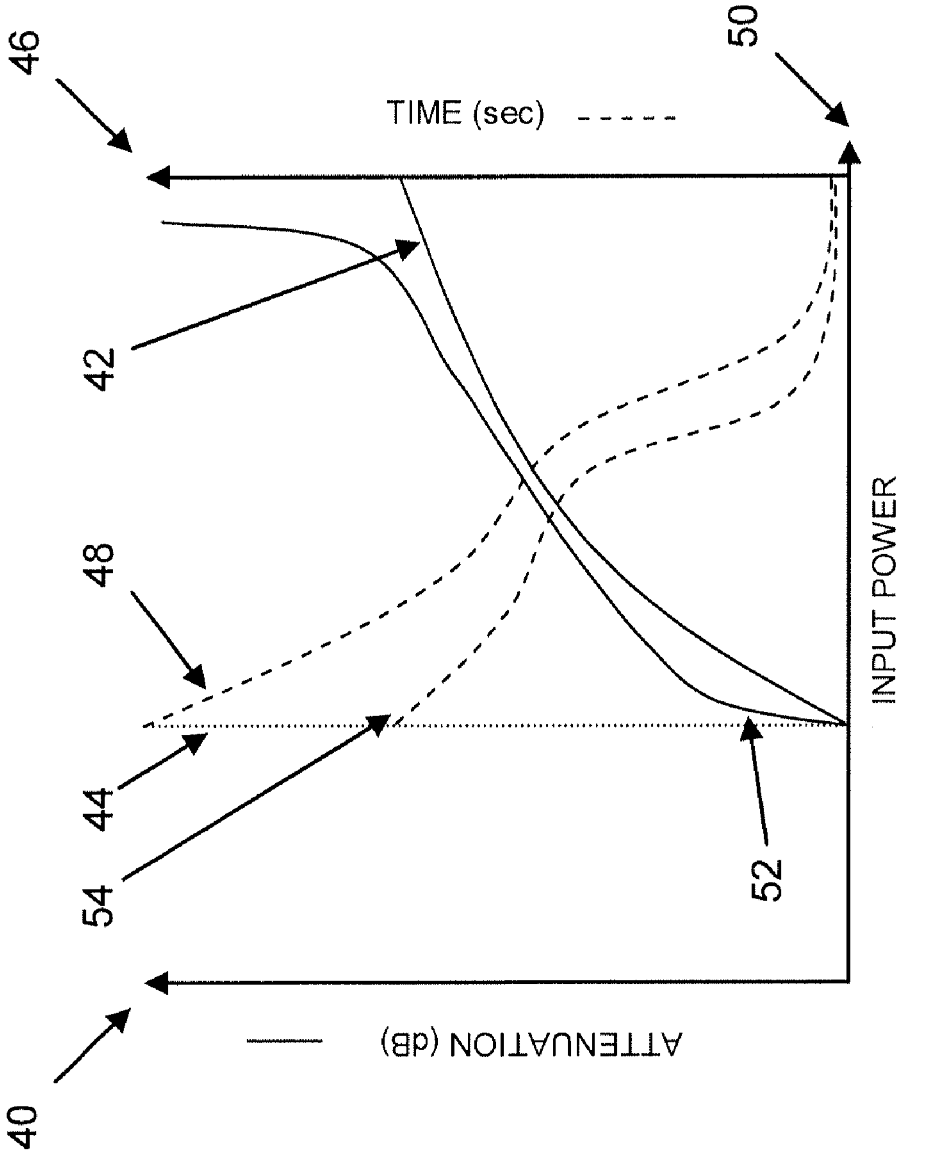
FIG. 6C is a plot of typical loudspeaker power handling characteristics overlaid with a typical three-stage second embodiment of the present invention.

The resulting characteristics of a two-stage second preferred embodiment are illustrated in FIG. 6B wherein the protection circuit broadly comprises one rectification stage, two detection stages, two timing stages, two actuation stages, one lamp attenuation stage, and one regulation stage. Referring to FIG. 6C, the resulting characteristics of a three-stage second preferred embodiment are illustrated wherein the protection circuit broadly comprises one rectification stage, three detection stages, three timing stages, three actuation stages, two lamp attenuation stages, and one regulation stage.

Figure 4A:
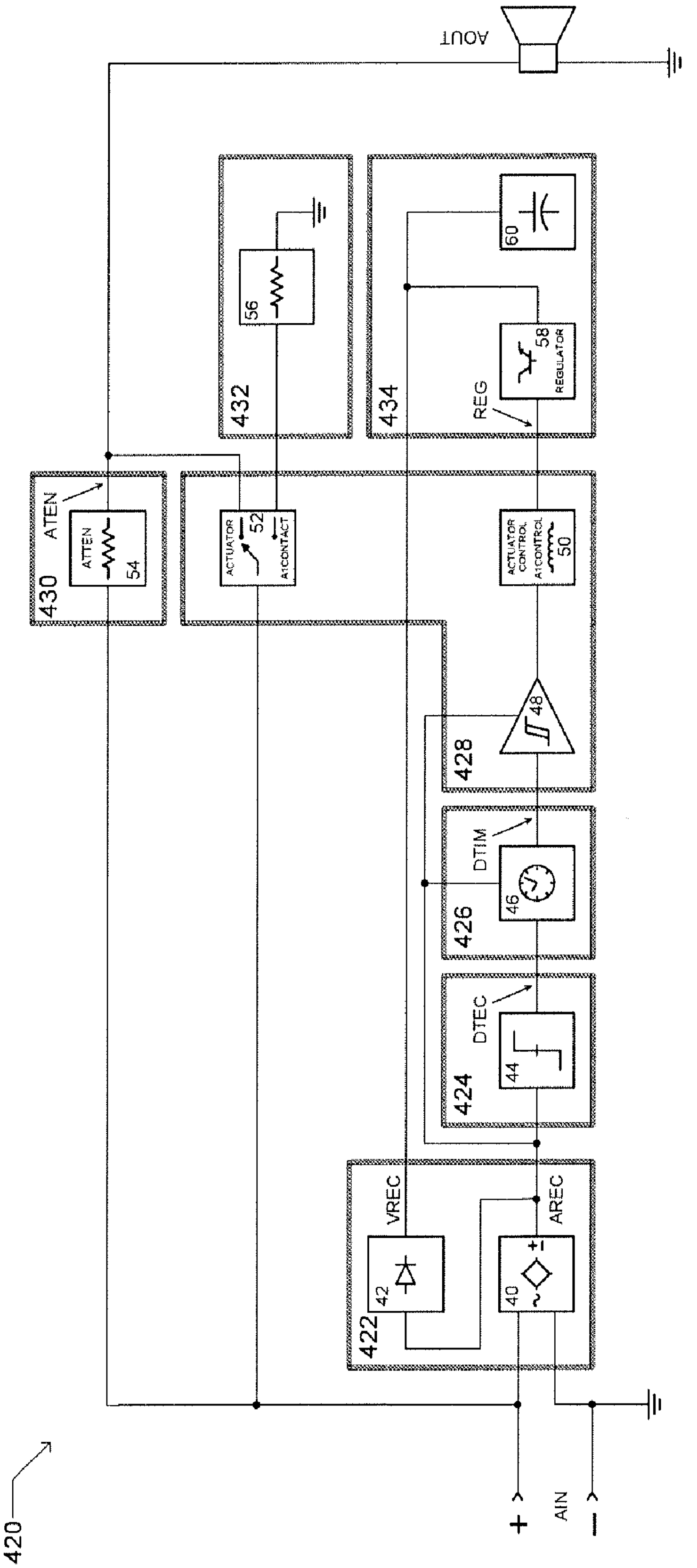
FIG. 4A is a block diagram of a third preferred embodiment of the present invention.

Referring to FIG. 4A, a protection circuit 420 is shown constructed in accordance with a preferred third embodiment of the present invention. The protection circuit 420 is operable to provide fully adjustable dynamic attack timing & threshold, minimized insertion loss, gradual dynamic attenuation, high speed peak over-voltage protection, wide operational power range, optional load balancing, full-bandwidth operation, and anti-chatter actuation hysteresis through the use of a voltage detector, a timer, hysteresis driven actuator, attenuator, regulator, and optional load balancer. The third preferred loudspeaker protection circuit broadly comprises a rectification stage 422; a detection stage 424; a timing stage 426; an actuator stage 428 with hysteresis drive; an attenuation stage 430; a regulation stage 434; and an optional load balancing stage 432. The third preferred loudspeaker protection circuit broadly comprises the same stages as discussed in regards to the first preferred embodiment; however, the actuation stage driver is designed utilizing a hysteresis technique.

Figure 4B:
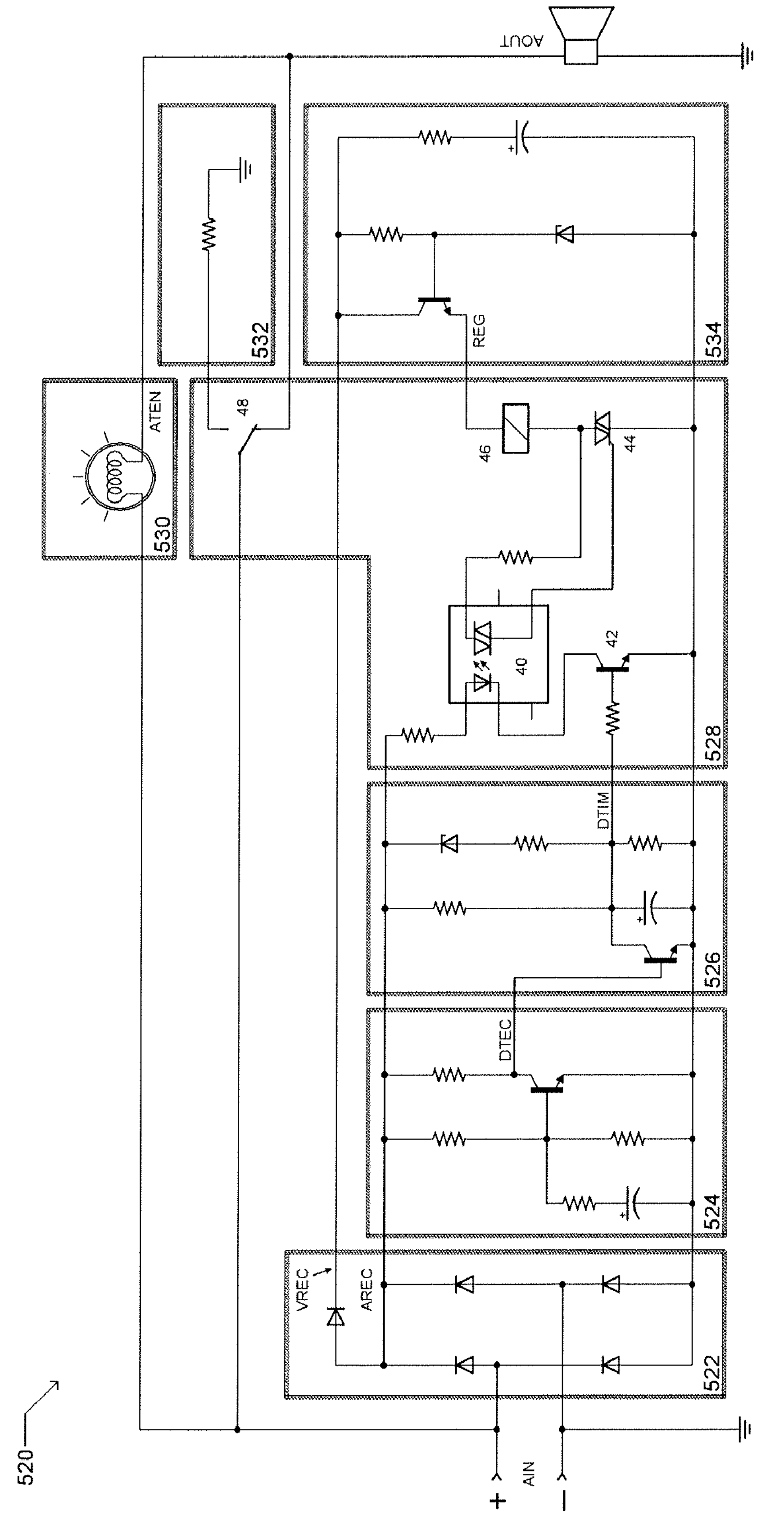
FIG. 4B is a circuit diagram of a third preferred embodiment of the present invention.

The actuation stage 428 is operable to drive a suitable actuator and broadly comprises a hysteresis driver 48, an actuator controller 50, and an actuator switch 52. Selection of the actuator switch 52 depends upon the application and if the optional load balancing stage 432 will be installed. Referring to FIG. 4B, a detailed example of the third embodiment 520, illustrates one possible implementation of the actuation stage 528 wherein the driver is a optically coupled triac trigger device, a triggering transistor 42, and control triac 44, the actuator controller is relay coil 46, and the actuator switch 48 is a single-pole, double throw (SPDT) relay contact closure. Driver transistor 42 detects when DTIM has reached an active high stage, upon which it will become conductive, allowing current to pass through the light emitting diode within optically coupled triac trigger 40. Optically-coupled triac trigger 40 then triggers control triac 44, which conducts current through relay coil 46. This approach differs from the first embodiment in that once the control triac 44 is triggered, it will remain active until it is reversed biased and/or the rated hold current of triac 44 is not met allowing the current flow to cease. Such a topology allows for a significant hysteresis window between the overall protection circuit trip voltage and release voltage, thereby removing actuator chatter. The remaining components of the actuation stage 528, relay coil 46 and relay switch 48 are typically the same as that discussed in the first preferred embodiment.

Figure 5A:
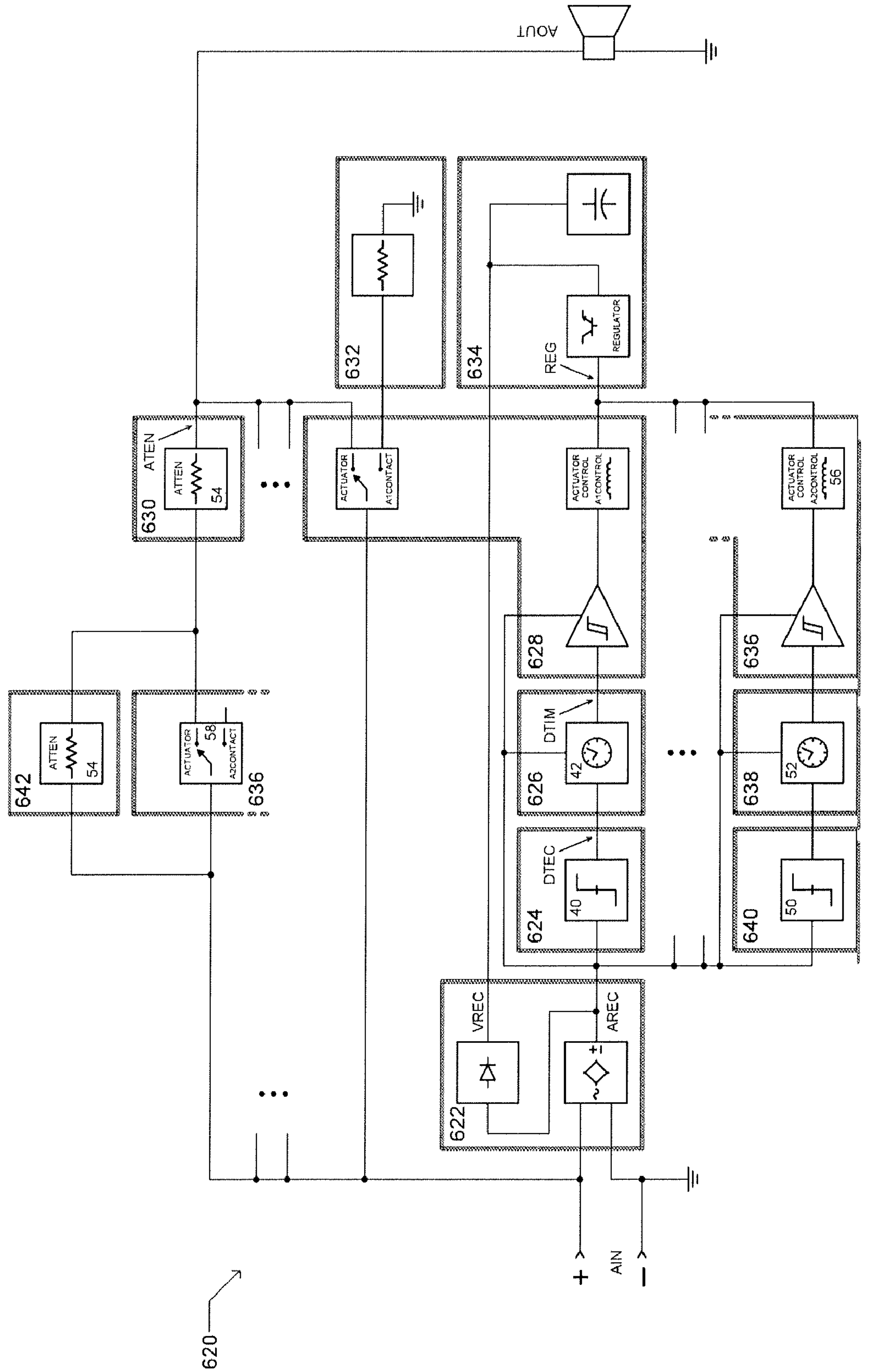
FIG. 5A is a block diagram of a multi-stage fourth preferred embodiment of the present invention.

Referring to FIG. 5A, a protection circuit 620 is shown constructed in accordance with a preferred fourth embodiment of the present invention. The protection circuit 620 is operable to provide multiple stages of fully adjustable dynamic attack timing & thresholds, minimized insertion loss, multiple stages of gradual dynamic attenuation, high speed peak over-voltage protection, wide operational power range, optional load balancing, full-bandwidth operation, and multiple stages of anti-chatter actuation hysteresis through the use of multiple voltage detectors, multiple timers, multiple actuators with hysteresis, multiple attenuators, regulator, and optional load balancer. The fourth preferred loudspeaker protection circuit broadly comprises the same stages as discussed in regards to the third preferred embodiment; however, includes a plurality of detection stages 624 & 640, timing stages 626 & 638, actuation stages 628 & 636 with hysteresis, and attenuation stages 630 & 642. The purpose of adding multiple detectors, timers, hysteresis actuators, and attenuators is to allow attenuation stage over-voltage protection (such a lamp filament protection) and allow more closely matched attenuation and timing characteristics when compared to the requirements of the loudspeaker being protected. The exact number of additional detection, timing, actuation, and attenuation stages needed depends upon the application; however, lab results indicate no more than three of each of these stages allows adequate control of attenuation and timing characteristics.

Figure 5B:
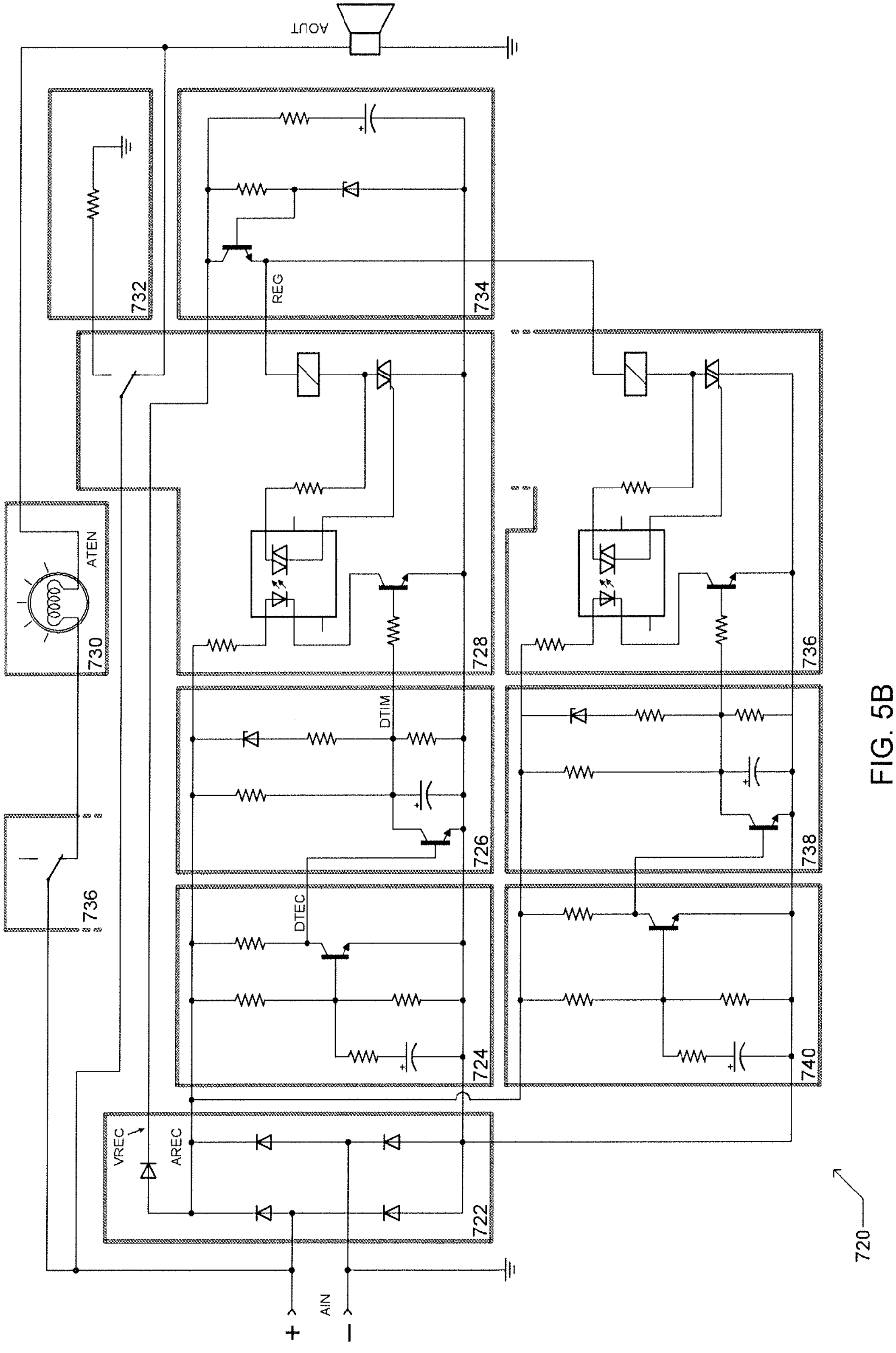
FIG. 5B is a circuit diagram of a multi-stage fourth preferred embodiment of the present invention.

Referring to FIG. 5B, a detailed example of the fourth embodiment 720, illustrates a two stage design including one rectification stage 722, two detection stages 724 & 740, two timing stages 727, & 738, two actuation stages 728 & 736 with driver hysteresis, a single attenuation stage 730, an optional load balancing stage 732 and a regulation stage 734. A second attenuation stage is optional; however, lab results indicate a single attenuator is satisfactory for most applications.

It will be appreciated by those with ordinary skill in the electrical arts that the multiple stage second and fourth embodiments, FIGS. 3A, 3B, 5A, and 5B could be combined so as to include both non-hysteresis actuation drivers and actuation drivers with hysteresis, if desired.

It will also be appreciated by those with ordinary skill in the electrical arts that various stages within all of the preferred embodiments, FIGS. 2A, 2B, 3A, 3B, 4A, 4B, 5A, and 5B, could be implemented within a programmable device such as a low-power microcontroller. For example, one skilled in the electrical arts could implement the detection stage, timing stage, and driver stage into a low-power, low-cost microcontroller device, if desired.

Although the invention has been described with reference to the preferred embodiment illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A loudspeaker protection circuit comprising:

a rectification stage for receiving an input audio signal and producing a rectified output signal;

a detection stage for passing the rectified output signal when the rectified output signal is greater than a predetermined level;

a timing stage for receiving the rectified output signal from the detection stage and producing a time-varying charge signal;

a regulation stage for producing a regulated output signal based on the input audio signal;

an actuator stage for actuating a switch based on the time-varying charge signal and the regulated output signal; and an attenuation stage for attenuating an output audio signal when the switch is actuated.

2. The loudspeaker protection circuit of claim 1, further comprising a load balancing circuit balancing the load on the output audio signal when the switch is actuated.

3. The loudspeaker protection circuit of claim 1, wherein the rectification stage includes a bridge rectifier circuit.

4. The loudspeaker protection circuit of claim 1, wherein the detection stage includes a voltage divider circuit.

5. The loudspeaker protection circuit of claim 1, wherein the timing stage includes a two-stage, retriggerable, charge-up resistive capacitive timer network.

6. The loudspeaker protection circuit of claim 1, wherein the regulation stage includes a regulation device and a capacitive smoothing network.

7. The loudspeaker protection circuit of claim 1, wherein the actuator stage includes a driver and an actuator controller.

8. The loudspeaker protection circuit of claim 7, wherein the driver includes a hysteresis driver.

9. The loudspeaker protection circuit of claim 1, wherein the attenuation stage includes a lamp.

10. The loudspeaker protection circuit of claim 1, wherein the detection stage includes a plurality of detection stages operating in parallel.

11. The loudspeaker protection circuit of claim 1, wherein the timing stage includes a plurality of timing stages operating in parallel.

12. The loudspeaker protection circuit of claim 1, wherein the actuator stage includes a plurality of actuator stages operating in parallel.

13. The loudspeaker protection circuit of claim 1, wherein the attenuation stage includes a plurality of attenuation stages operating in series.

14. A loudspeaker protection circuit comprising:

a rectification stage, including a bridge rectifier circuit, for receiving an input audio signal and producing a rectified output signal;

a detection stage, including a voltage divider circuit, for passing the rectified output signal when the rectified output signal is greater than a predetermined level;

a timing stage, including a two-stage, retriggerable, charge-up resistive capacitive timer network, for receiving the rectified output signal from the detection stage and producing a time-varying charge signal;

a regulation stage, a regulation device and a capacitive smoothing network, for producing a regulated output signal based on the input audio signal;

an actuator stage, including a driver and an actuator controller, for actuating a switch based on the time-varying charge signal and the regulated output signal;

an attenuation stage, including a lamp, for attenuating an output audio signal when the switch is actuated; and a load balancing circuit for balancing the load on the output audio signal when the switch is actuated.

15. The loudspeaker protection circuit of claim 14, wherein the driver includes a hysteresis driver.

16. A loudspeaker protection circuit comprising:

a rectification stage, including a bridge rectifier circuit, for receiving an input audio signal and producing a rectified output signal;

a plurality of detection stages operating in parallel, each including a voltage divider circuit, for passing the rectified output signal when the rectified output signal is greater than a predetermined level;

a plurality of timing stages operating in parallel, each including a two-stage, retriggerable, charge-up resistive capacitive timer network, for receiving the rectified output signal from the detection stage and producing a time-varying charge signal;

a regulation stage, a regulation device and a capacitive smoothing network, for producing a regulated output signal based on the input audio signal;

a plurality of actuator stages operating in parallel, each including a driver and an actuator controller, for actuating a switch based on the time-varying charge signal and the regulated output signal;

a plurality of attenuation stages operating in series, each including a lamp, for attenuating an output audio signal when the switch is actuated; and a load balancing circuit for balancing the load on the output audio signal when the switch is actuated.

17. The loudspeaker protection circuit of claim 16, wherein the driver includes a hysteresis driver.

* * * * *